United States Patent
Carney et al.

(10) Patent No.: US 6,437,992 B1
(45) Date of Patent: Aug. 20, 2002

(54) HOT PLUGGABLE PRINTED CIRCUIT BOARD INSULATING SYSTEM AND METHOD

(75) Inventors: James M. Carney, Pepperell; William A. Izzicupo, Bedford; Robert S. Antonuccio, Burlington; Timothy M. Holland, West Boylston, all of MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/468,994

(22) Filed: Dec. 21, 1999

(51) Int. Cl.[7] ................................................. H05K 7/14
(52) U.S. Cl. ....................... 361/796; 361/788; 361/798; 361/801
(58) Field of Search .................. 361/788, 798, 361/799, 800, 801–802, 816, 818, 829; 206/706; 211/41.17

(56) References Cited

U.S. PATENT DOCUMENTS

| 5,023,754 A | * | 6/1991 | Aug et al. ................... 361/800 |
| 5,530,302 A | | 6/1996 | Hamre et al. |
| 5,642,264 A | * | 6/1997 | Cantrell ....................... 361/802 |
| 5,644,477 A | * | 7/1997 | Klein .......................... 361/729 |
| 5,652,697 A | * | 7/1997 | Le .............................. 361/780 |
| 5,808,876 A | | 9/1998 | Mullenbach et al. |
| 6,030,230 A | | 2/2000 | Peacock |
| 6,166,919 A | * | 12/2000 | Nicolici et al. ............. 361/800 |
| 6,169,662 B1 | * | 1/2001 | Clark et al. ................. 361/754 |

* cited by examiner

Primary Examiner—Kamand Cuneo
Assistant Examiner—Tuan Dinh
(74) Attorney, Agent, or Firm—Kudirka & Jobse, LLP

(57) ABSTRACT

An insulating guard is mounted over a backplane or motherboard in an electronic system that accepts hot pluggable circuit cards. The insulating guard has openings that expose only the connectors and allow a hot pluggable circuit card to be inserted without the possibility of shorting the backplane. In order to prevent contact between a card being inserted and adjacent cards that have already been connected to the system, the invention provides for insulating card dividers which are connected to the insulating guard and fit between adjacent cards. The card dividers can be attached to the insulating guard by parts which snap together, fasteners or adhesives.

20 Claims, 7 Drawing Sheets

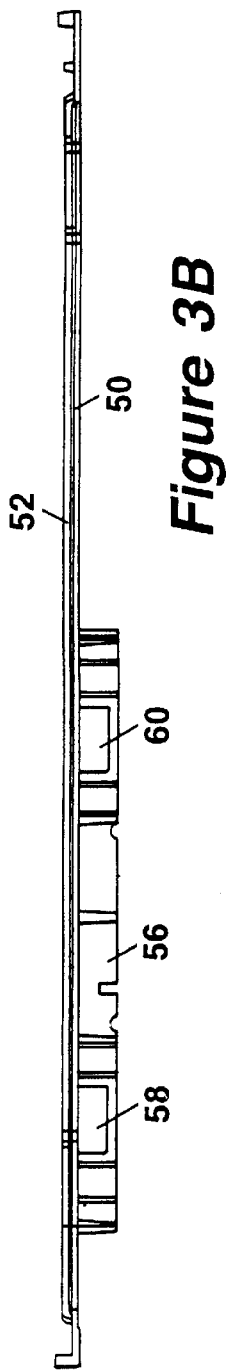
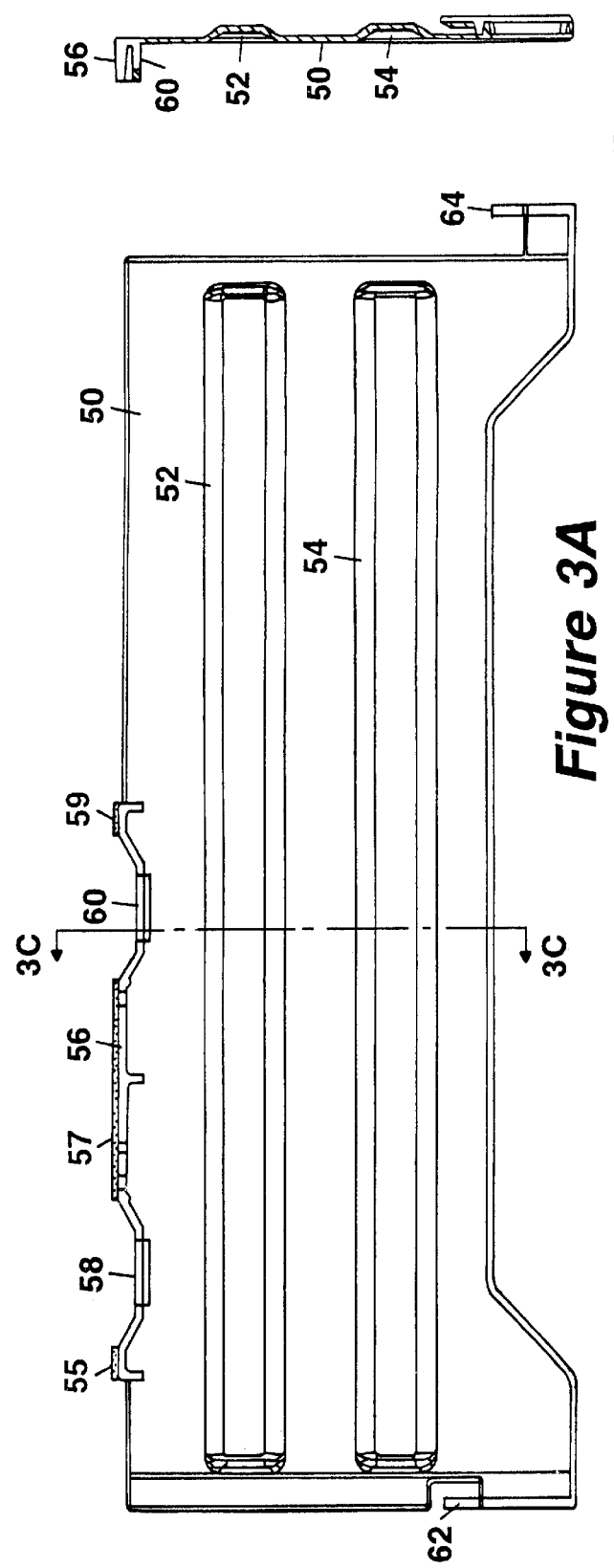

HOT PLUGGABLE PRINTED CIRCUIT BOARD INSULATING SYSTEM AND METHOD

FIELD OF THE INVENTION

This invention relates generally to computer systems which utilize devices on printed circuit cards which may be added to or removed from the system the system is initialized and while the system is powered up.

BACKGROUND OF THE INVENTION

Complex electronic equipment is typically constructed as a set of printed circuit cards which connect to a backplane or motherboard (hereinafter together referred to as a backplane), wherein each printed circuit card contains a section or module of the equipment and the backplane contains the interconnections between the circuit cards. This construction allows cards to be physically removed and inserted into connectors or expansion "slots" which are, in turn, connected to the backplane or motherboard. The connectors allow a card and the associated peripheral to be easily added or removed from the computer system, thereby allowing for maintenance and system configuration, changes.

In many electronic systems, the printed circuit cards must be inserted or removed from their connectors in order to configure the system before the system is powered up or initialized. However, more recently, electronic systems have been designed so that some or all of the printed circuit boards can be inserted or removed from their connectors while the associated electronic system is powered up and continues to operate, a capability called "hot swapping" or "hot pluggable."

Some standards that include hot swapping capability have been developed. For example, computers and peripheral devices which adhere to the Personal Computer Memory Card International Association (PCMCIA) standard permit the hot insertion and hot removal of peripherals and this standard is presently in common use with notebook and laptop computers. Consequently, many peripheral devices that adhere to the PCMCIA standard are already in existence.

Aside from obvious power surge problems that occur when a card is inserted into the system, one impediment to inserting or removing peripheral devices from some electronic systems while they continue to operate arises from operator error. For example, when the card is being inserted, the operator may inadvertently touch the card against another adjacent card or against exposed connections in the backplane or motherboard. The result is that an electrical short circuit is created which can apply power to inappropriate places in the inserted card or the existing cards and damage them. Since there is no way to predict how the shorts will occur, they cannot be eliminated by design.

Consequently, although hot pluggable cards are designed to be inserted and removed from. an operational system, in some cases their use is curtailed to prevent the possibility of a catastrophic failure. Accordingly, there is a need to prevent such a possibility.

SUMMARY OF THE INVENTION

In accordance with the principles of the invention, an insulating guard is mounted over the backplane or motherboard. The insulating guard has openings that expose a only the connectors and allow a hot pluggable circuit card to be inserted without the possibility of shorting the backplane. In order to prevent contact between a card being inserted and adjacent cards that have already been connected to the system, the invention provides for insulating card dividers that are connected to the insulating guard and fit between adjacent cards. In accordance with one embodiment, the card dividers are attached to the insulating guard by parts that snap together. In accordance with another embodiment, the card dividers are attached to the insulating guard by fasteners. In accordance with still another embodiment, the card dividers are attached to the insulating guard by adhesives.

BRIEF DESCRIPTION OF THE DRAWINGS

The above and further advantages of the invention may be better understood by referring to the following description in conjunction with the accompanying drawings in which:

FIGS. 3A, 3B and 3C are plan, elevation and cross-sectional views of an insulating card divider.

DETAILED DESCRIPTION

Figure 1:
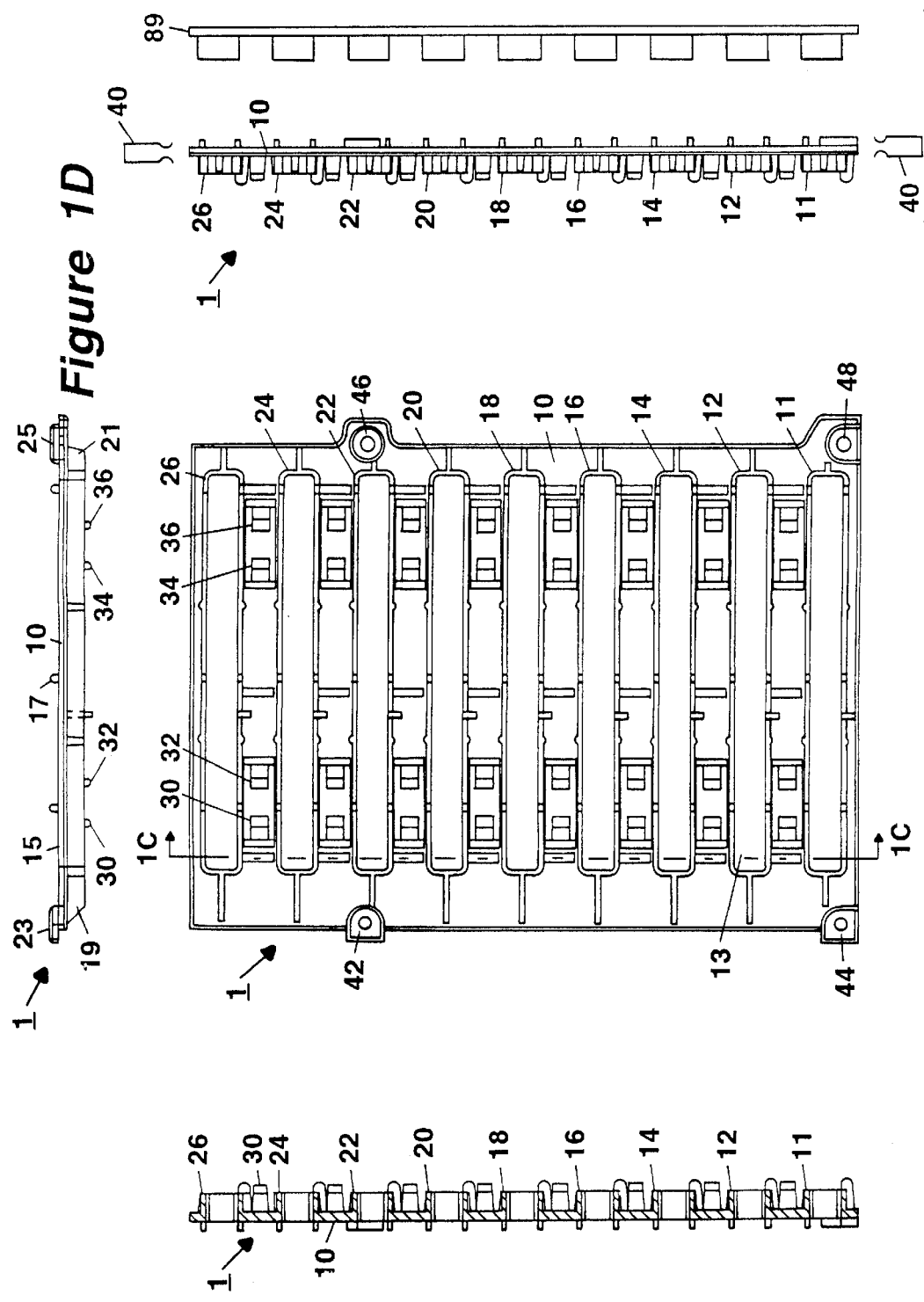
FIGS. 1A, 1B, 1C and 1D are plan, side elevation, cross-sectional and top elevation views of the insulating guard.
Figure 2:
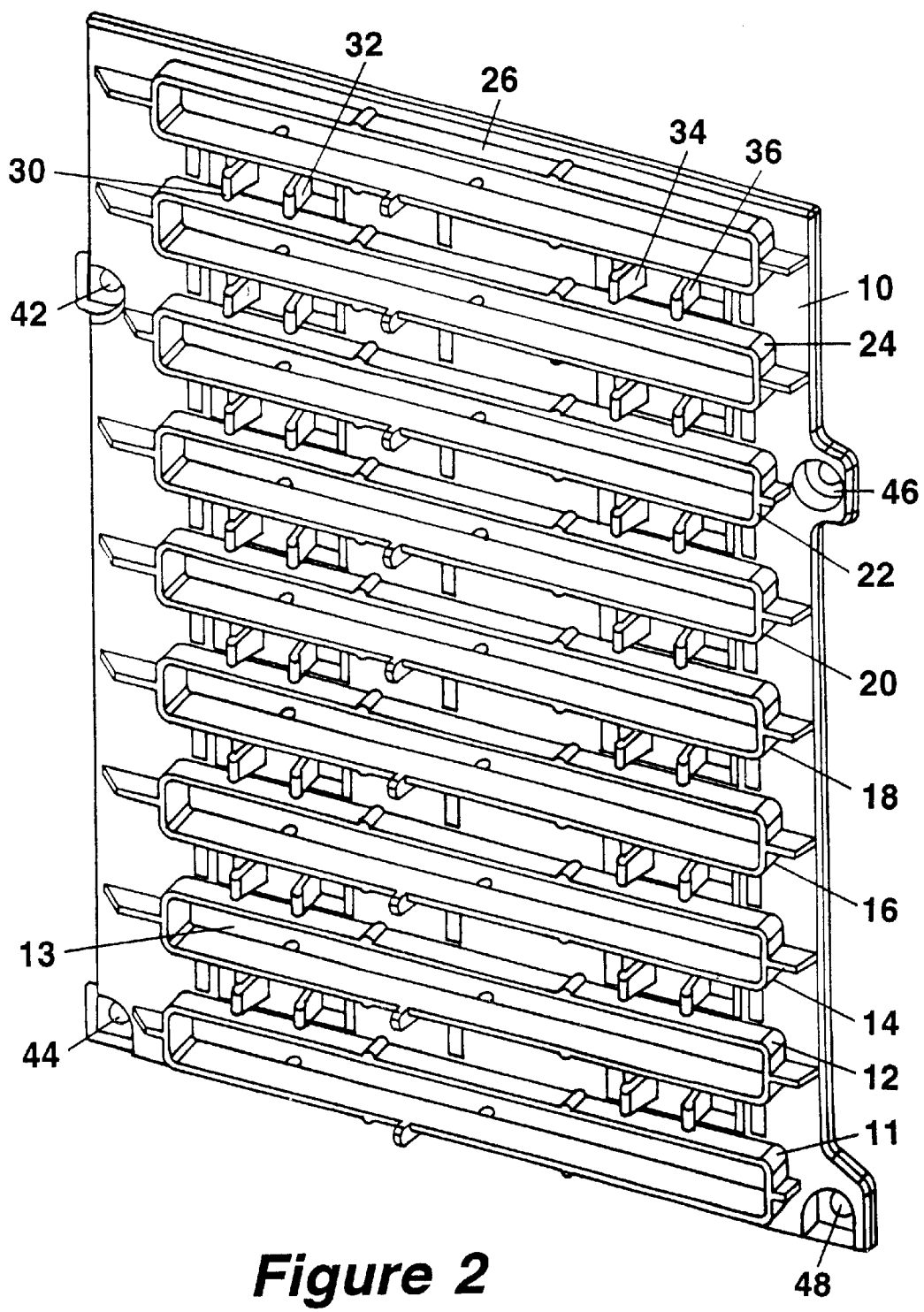
FIG. 2 is a perspective view of the insulating guard.

The inventive hot pluggable card insulating system comprises an insulating guard and one or more insulating card dividers. The insulating guard is shown in detail in FIGS. 1A–1D and FIG. 2. FIGS. 1A, 1B, 1C and 1D illustrate plan, side elevation, cross-sectional and top elevation views, respectively. The insulating guard 1 comprises a flat base panel 10 of generally rectangular shape which has a size and shape sufficient to cover a portion of the backplane used for hot. pluggable card connections. The insulating guard 1 is intended to cover the exposed electrical conductors on the backplane in the hot pluggable card area and one or more. hot pluggable circuit cards can be inserted through. the insulating guard and plugged into connectors on the underlying backplane. A number of rectangular openings, such as opening 13, are provided to accommodate the edge connector of the circuit cards. The insulating guard 1 illustrated in FIGS. 1A–1D accommodates eight circuit cards; however, more or less printed circuit cards can be accommodated by changing the shape and size of the guard 1 without departing from the spirit and scope of the invention.

Each of the printed circuit card openings is surrounded by a raised flange, of which flanges 11, 12, 14, 16, 18, 20, 22, 24 and 26 are illustrated. The flanges guide the edge connector of a circuit card into position over the connector of the underlying backplane. The guard 1 preferably has stiffening ribs near the flanges, such as ribs 15 and 17. Other rib configurations will be apparent to those skilled in the art. The flanges may also have stiffening bolsters, such as bolsters 19 and 21 molded along their edges.

The insulating guard 1 is preferably constructed out of a suitable insulating material such as a resin polymer material that is easily moldable. Suitable materials include General Electric Cycoloy C2950HF or Bayer FR110PC/ABS resin polymer materials.

Figure 5:
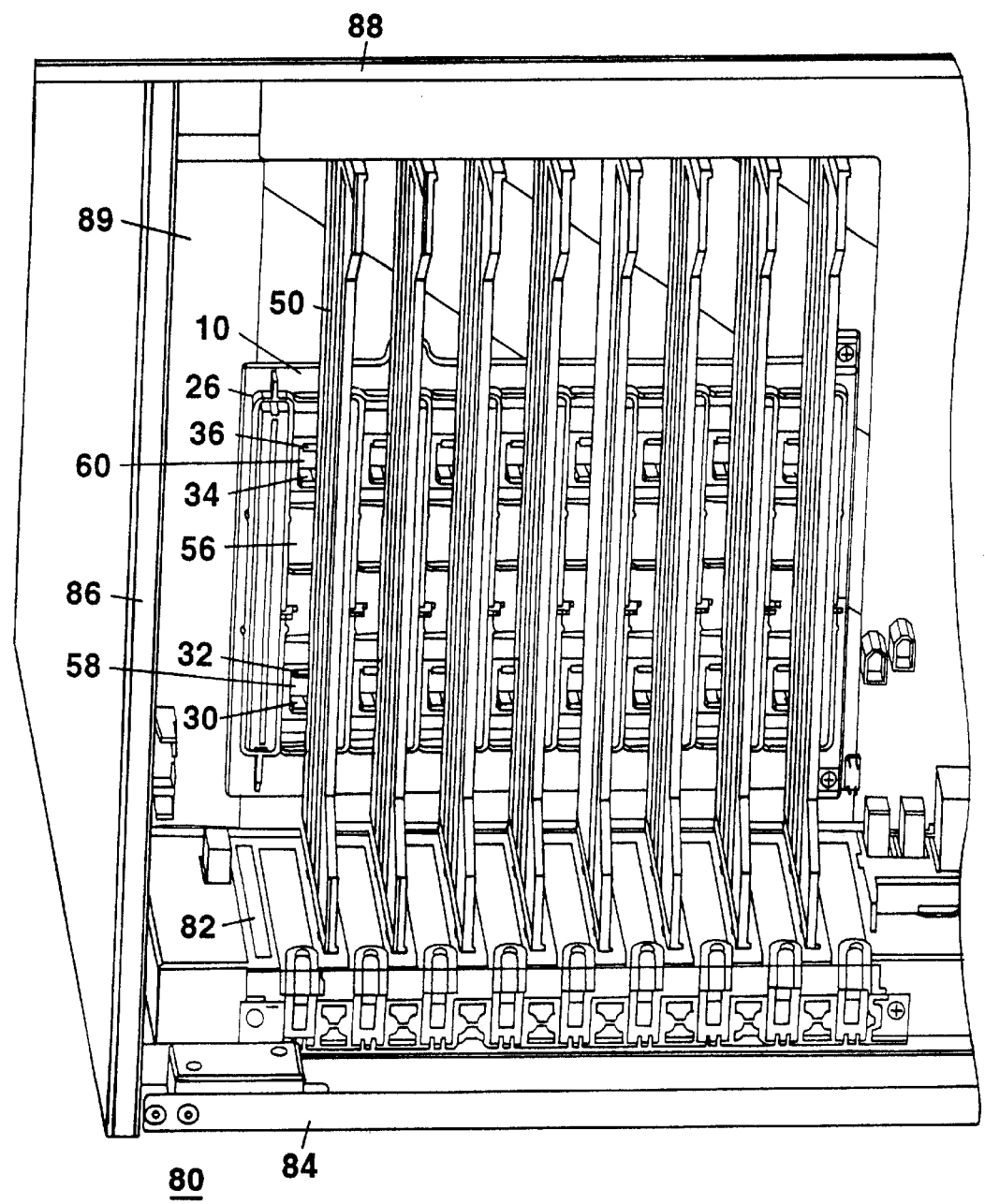
FIG. 5 is a perspective view of an electronic system chassis with the inventive insulating guard and card dividers in place.
Figure 6:
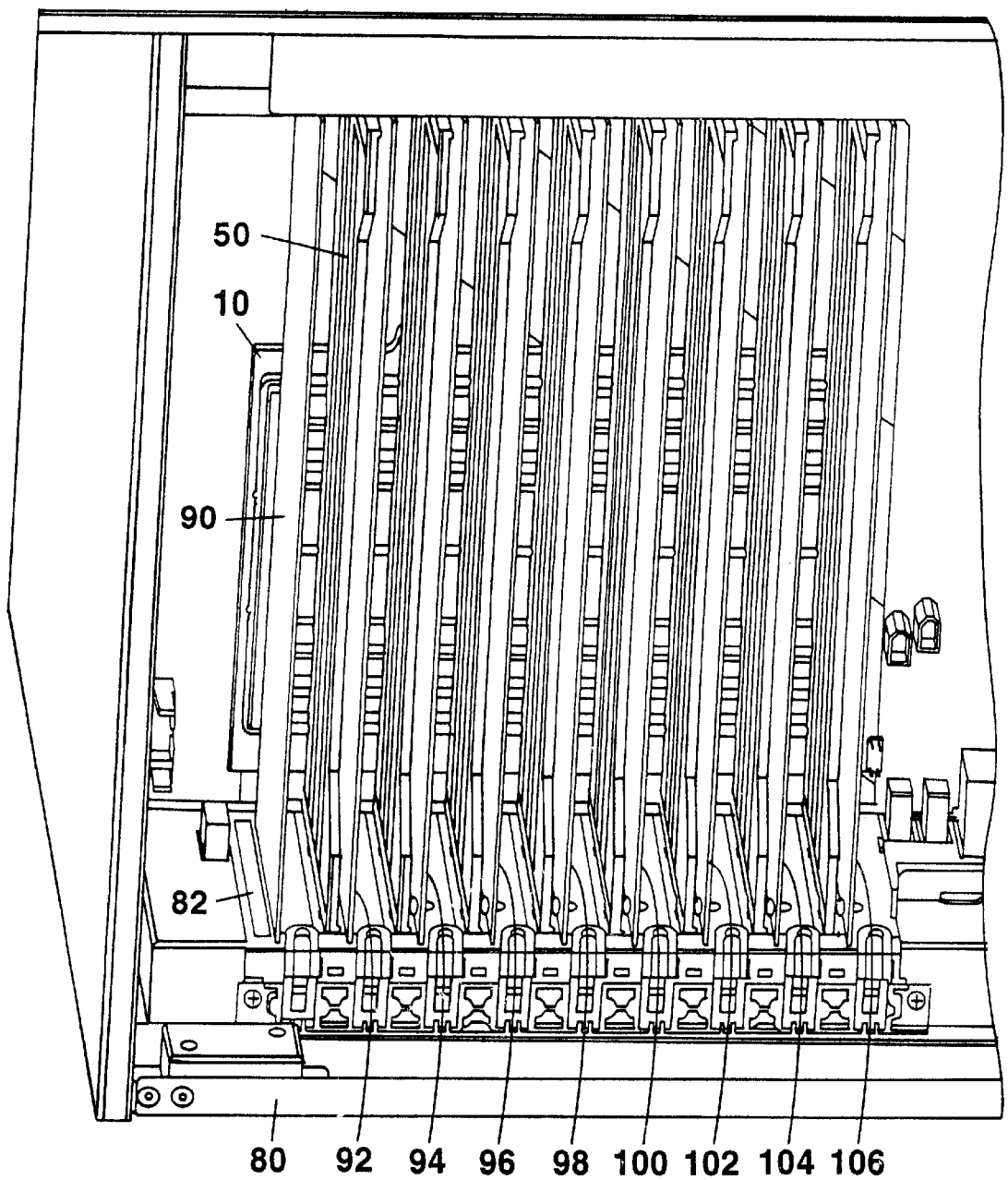
FIG. 6 is a perspective view of an electronic system chassis with the inventive insulating guard and card dividers in place illustrating several printed circuit cards in place.

In use, the insulating guard 1 is fastened over the backplane as illustrated in FIGS. 5 and 6. The fastening means can be any suitable mechanism. For example FIG. 1A illustrates four holes 42, 44, 46 and 48 located along the periphery of the guard 1. These holes can accommodate hold down screws that fasten the backplane board to the equipment chassis and these hold down screws can be used to hold the guard in position. Screws other than the hold down screws can also be used. Preferably, each of holes 42–48 has a small raised land on the underside of the guard. Two of these lands are shown as lands 23 and 25 in FIG. 1D. The lands provide a small clearance between the guard and the backplane board to prevent the guard from damaging the conductors on the surface of the backplane board. Other mounting mechanisms could be used such as clips or other fasteners which would allow the insulating guard 1 to be removed for maintenance purposes. For example, FIG. 1B shows insulating guard 1 and a back-plane board 89 with two clips 40 that fasten the guard 1 to the backplane board 89. Although only two clips 40 are shown, additional clips may also be used.

The insulating guard 1 is preferably used with an insulating card guide mounted between each pair of circuit cards. In order to provide more integrity to the insulating system, the insulating guard and the card dividers are connected together. In a preferred embodiment, the card dividers snap onto the insulating guard. In particular, the insulating guard 1 has resilient fingers associated with each pair of connector slot flanges, which. resilient fingers are used to hold an insulating card divider in position between the flanges. For example, resilient fingers 30, 32, 34 and 36 illustrated in FIGS. 1A and 1D are located between flanges 24 and 26. In a similar manner, identical fingers are located between each of the other flanges to hold the card dividers in position. Each of the pair of resilient fingers bend inward and have hooked ends (as shown in FIG. 1D) which grip the card divider as will be hereinafter described. The raised flanges, 11–26 and the resilient fingers 32–36 are shown in more detail in the perspective view of FIG. 2.

Figure 4:
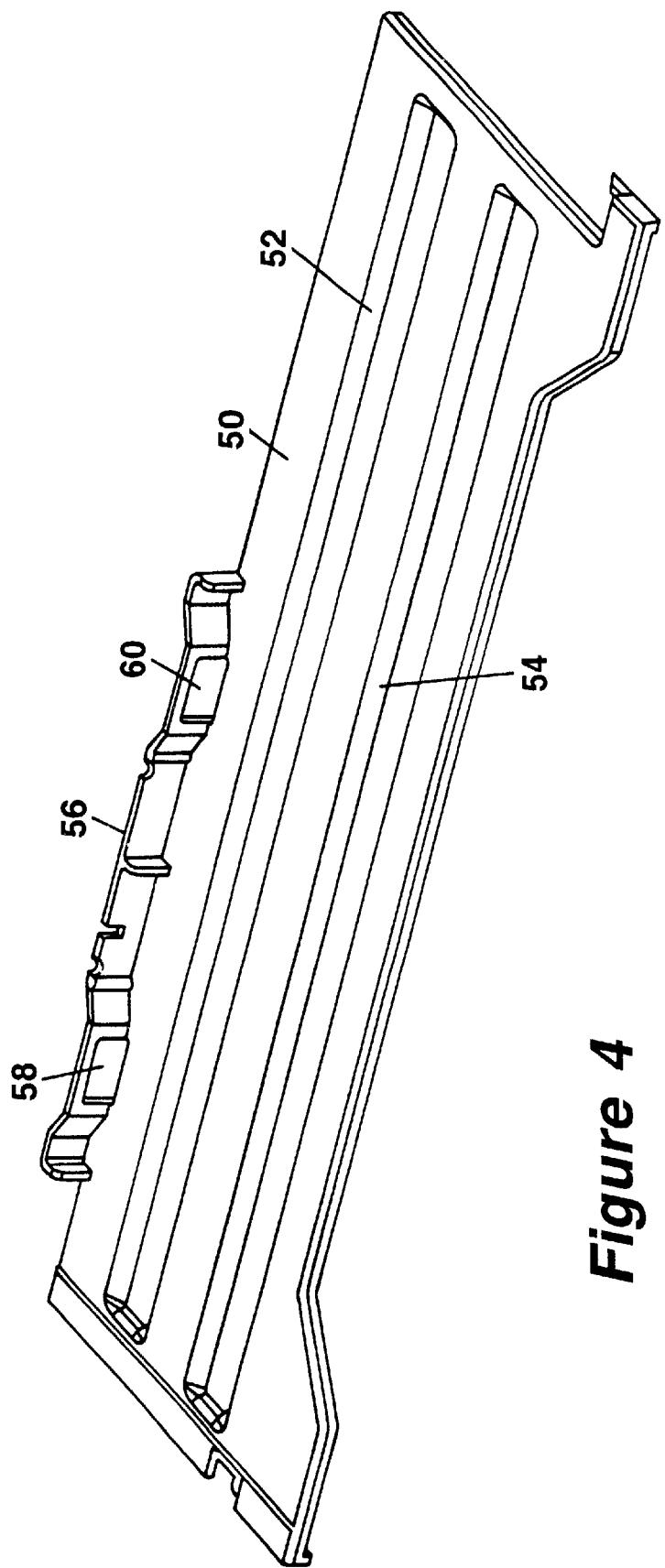
FIG. 4 is a perspective view of an insulating card divider.

The insulating card dividers are shown in FIGS. 3A, 3B and 3C that represent plan, elevation and cross-sectional views, respectively. Each insulating divider consists of an approximately rectangular planar panel 50 which may have raised stiffening rails 52 and 54 molded therein. Along one side of the card divider, mounted perpendicular to the flat surface of the panel 50, is an extension shelf 56 that extends at right angles to the panel 50. The extension shelf 56 has two holes illustrated as holes 58 and 60 through which the aforementioned resilient fingers in the insulating guard 1 can pass through, and expand outward and lock. The extension shelf may also have various stiffening ribs known to those in the art. The extension shelf 56 is shown in more detail in the perspective view illustrated in FIG. 4.

The insulating card divider can illustratively be manufactured from the same plastic material as the insulating guard or from another suitable material. The card divider may also be provided with fingers 62 and 64 that slide into slots provided in the electronic module chassis as illustrated in FIGS. 5 and 6.

Although the insulating card dividers are connected to the insulating guard by the resilient fingers in a preferred embodiment, other means of fastening the two pieces together can also be used. For example, a card divider can also be fastened to the insulating guard by means of separate fasteners, such as screws or bolts. Alternatively, the two pieces can be fastened together by means of a suitable adhesive. This adhesive can be placed on surfaces 55, 57 and 59 shown in FIG. 3A in order to fasten the pieces together.

FIG. illustrates an electronic module chassis 80 comprised of two side panels 84 and 88 and two ends panels of which only end panel 86 is illustrated in FIGS. 5 and 6. The side panels 84, 88, and the end panels 86 form an open box with the backplane card 89 mounted in the bottom.

Figure 7:
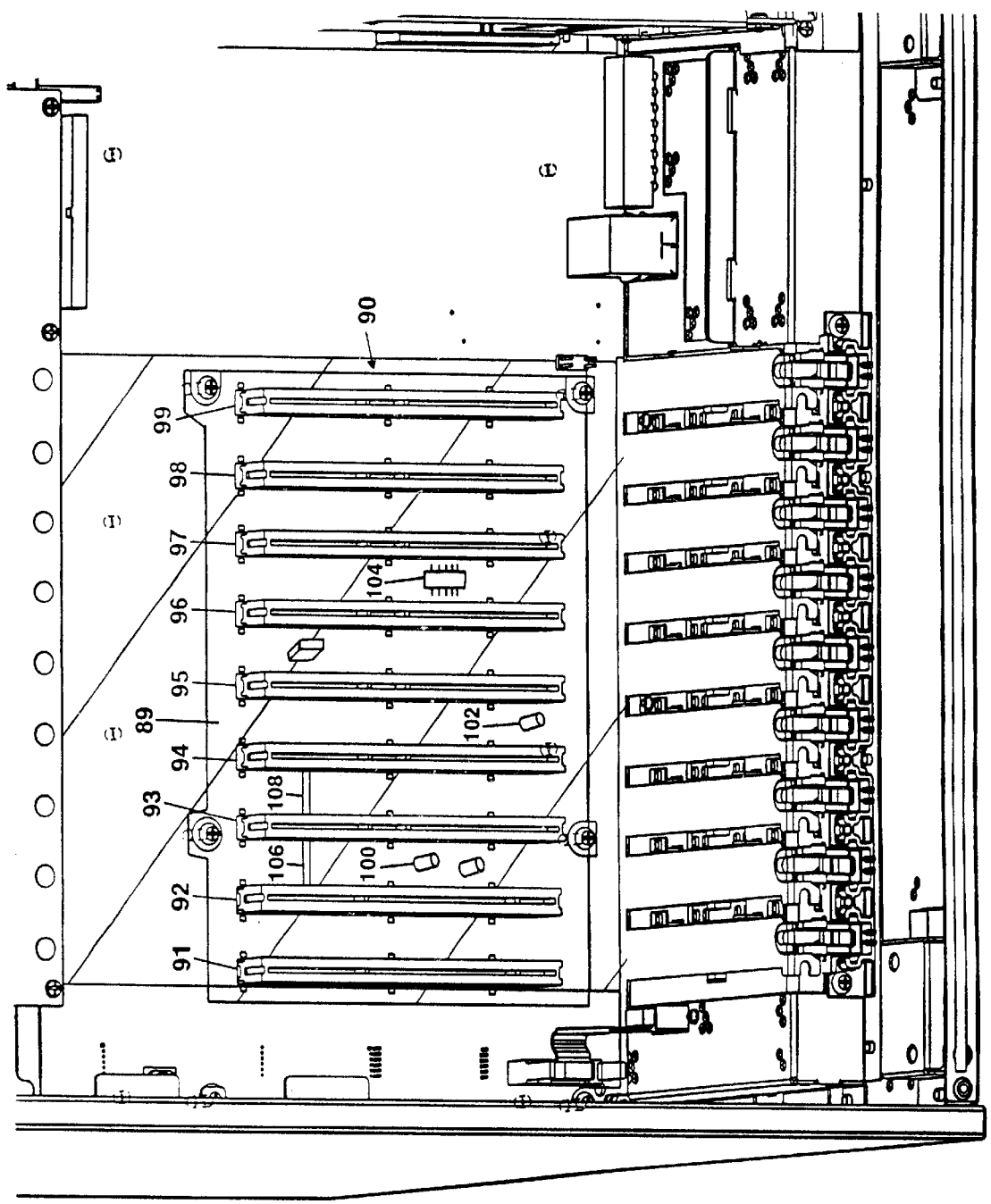
FIG. 7 is a perspective view of an illustrative backplane showing the electrical connectors into which circuit boards are inserted.

FIG. 7 illustrates the backplane card 89 and shows a hot pluggable area 90 containing connectors 91, 92, 93, 94, 95, 96, 97, 98 and 99 into which circuit boards can be hot plugged. Also mounted on backplane board 89, are a number of electrically conductive elements and conductors, of which elements 100, 102 and 104 and conductors 106 and 108 are shown. Without protection, a circuit board being inserted into one of connectors 91–99 could electrically short against one of these conductive elements and cause a failure.

In FIG. 5, the insulating guard 1 is shown mounted over the hot pluggable area of the backplane board 89. FIG. 5 illustrates the insulating system with eight insulating card dividers mounted in position. In each card divider the resilient fingers of the underlying guard (for example, fingers 30, 32, 34 and 36) extend through holes 58 and 60, respectively, in the extension shelf of the card divider and lock in position to hold the insulating card divider in position relative to the insulating guard 1. The module chassis. 80 may have recesses, for example recess 82, molded in its side with slots to receive one or both fingers 62 and 64 of each insulating card divider to hold the divider in position after the module is assembled.

FIG. 6 illustrates the module chassis 80 with a plurality of circuit boards 92–106 inserted in position between the insulating card dividers. As shown, any of printed circuit cards 92–106 can be inserted and removed with no danger of shorting between boards or shorting inadvertently against some exposed electrical elements on the underlying backplane 89.

Although an exemplary embodiment of the invention has been disclosed, it will be apparent to those skilled in the art that various changes and modifications can be made which will achieve some of the advantages of the invention without departing from the spirit and scope of the invention. For example, it will be obvious to those reasonably skilled in the art that, in some implementations, the insulating card dividers may not be necessary. Other aspects, such as the specific materials utilized to manufacture a particular element, as well as other modifications to the inventive concept are intended to be covered by the appended claims.

What is claimed is:

1. An insulating system for circuit cards, each having a length and which are hot pluggable into electrical connectors mounted on a backplane having electrical conductors that interconnect the cards and are exposed to electrical short circuits, the system comprising:

an insulating guard being composed of an electrically insulating material and having a shape and size configured to cover the exposed electrical conductors on the backplane and to have openings through which the circuit cards can be inserted;

a mounting mechanism for mounting the guard over the backplane with the openings located over the connectors on the backplane so that the circuit cards can be inserted through the openings into the connectors and are prevented from contacting the exposed electrical conductors;

an insulating card divider; and a fastening mechanism for fastening the insulating card divider to the insulating guard between two of the openings in the insulating guard so that the insulating card divider extends along the length of the circuit cards and prevents adjacent circuit cards from electrically contacting each other.

2. The insulating system of claim 1 wherein the insulating card divider is formed of a polymeric resin material.

3. The insulating system of claim 1 wherein the fastening mechanism comprises resilient fingers located on the insulating guard which snap into holes in the insulating card divider.

4. The insulating system of claim 1, wherein the fastening mechanism comprises a separate fastener.

5. The insulating system of claim 1, wherein the fastening mechanism comprises an adhesive located between the insulating guard and the insulating card divider.

6. The insulating system of claim 1 herein the insulating guard is formed of a polymeric resin material.

7. The insulating system of claim 1 wherein each of the openings has a flange surrounding the opening to guide one of the circuit cards which is inserted in the each opening.

8. The insulating system of claim 1 herein the backplane is mounted in an equipment chassis by hold down screws and the mechanism for mounting the guard over the backplane comprises holes in the insulating guard through which the hold down screws pass.

9. An insulating system for circuit cards which are hot pluggable into electrical connectors mounted on a backplane having electrical conductors that interconnect the cards and are exposed to electrical short circuits wherein the backplane is mounted in an equipment chassis, the system comprising:

an insulating guard being composed of an electrically insulating material and having a shape and size configured to cover the exposed electrical conductors on the backplane and to have openings through which the circuit cards can be inserted;

a mounting mechanism for mounting the guard over the backplane with the openings located over the connectors on the backplane so that the circuit cards can be inserted through the openings into the connectors and are prevented from contacting the exposed electrical conductors;

an insulating card divider having fingers which engage recesses in the equipment chassis; and a fastening mechanism for fastening the insulating card divider to the insulating guard between two of the openings in the insulating guard.

10. An insulating system for circuit cards which are hot pluggable into electrical connectors mounted on a backplane having electrical conductors that interconnect the cards and are exposed to electrical short circuits, the system comprising:

an insulating guard being composed of an electrically insulating material and having a shape and size configured to cover the exposed electrical conductors on the backplane and to have openings through which the circuit cards can be inserted;

clips for mounting the guard over the backplane with the openings located over the connectors on the backplane so that the circuit cards can be inserted through the openings into the connectors and are prevented from contacting the exposed electrical conductors an insulating card divider; and a fastening mechanism for fastening the insulating card divider to the insulating guard between two of the openings in the insulating guard so that the insulating card divider extends along the length of the circuit cards and prevents adjacent circuit cards from electrically contacting each other.

11. A method for insulating circuit cards each of which has a length and which are hot pluggable into electrical connectors mounted on a backplane having electrical conductors that interconnect the cards and are exposed to electrical short circuits, the method comprising:

(a) composing an insulating guard from an electrically insulating material and having a shape and size configured to cover the exposed electrical conductors on the backplane and to have openings through which the circuit cards can be inserted;

(b) mounting the guard over the backplane with the openings located over the connectors on the backplane so that the circuit cards can be inserted through the openings into the connectors and are prevented from contacting the exposed electrical conductors (c) forming an insulating card divider; and (d) fastening the insulating card divider to the insulating guard between two of the openings in the insulating guard so that the insulating card divider extends along the length of the circuit cards and prevents adjacent circuit cards from electrically contacting each other.

12. The method of claim 11 wherein the insulating card divider is formed of a polymeric resin material.

13. The method of claim 11 wherein step (d) comprises forming resilient fingers on the insulating guard which snap into holes in the insulating card divider.

14. The method of claim 11 wherein step (d) comprises using a separate fastener to fasten the card divider to the insulating guard.

15. The method of claim 11 wherein step (d) comprises fastening the card divider to the insulating guard with an adhesive placed between the card divider and the insulating guard.

16. The method of claim 11 wherein the insulating guard is formed of a polymeric resin material.

17. The method of claim 11 wherein step (a) comprises forming the insulating guard with a flange surrounding each of the openings to guide a circuit card which is inserted in the each opening.

18. The method claim 11 wherein the backplane is mounted in an equipment chassis by hold down screws and step (b) comprises forming holes in the insulating guard through which the hold down screws pass.

19. A method for insulating circuit cards which are hot pluggable into electrical connectors mounted on a backplane having electrical conductors that interconnect the cards and are exposed to electrical short circuits wherein the backplane is mounted in an equipment chassis, the method comprising:

(a) composing an insulating guard from an electrically insulating material and having a shape and size configured to cover the exposed electrical conductors on the backplane and to have openings through which the circuit cards can be inserted;

(b) mounting the guard over the backplane with the openings located over the connectors on the backplane so that the circuit cards can be inserted through the openings into the connectors and are prevented from contacting the exposed electrical conductors; and (c) forming an insulating card divider;

(d) fastening the insulating card divider between two of the openings in the insulating guard; and (e) forming fingers in the insulating card divider which fingers engage recesses in the equipment chassis.

20. A method for insulating circuit cards which are hot pluggable into electrical connectors mounted on a backplane having electrical conductors that interconnect the cards and are exposed to electrical short circuits, the method comprising:

(a) composing an insulating guard from an electrically insulating material and having a shape and size configured to cover:the exposed electrical conductors on the backplane and to have openings through which the circuit cards can be inserted;

(b) using clips to mount the insulating guard over the backplane with the openings located over the connectors on the backplane so that the circuit cards can be inserted through the openings into the connectors and are prevented from contacting the exposed electrical conductors;

(c) forming an insulating card divider; and (d) fastening the insulating card divider between two of the openings in the insulating guard.

* * * * *